(12) United States Patent
Tanaka et al.

(10) Patent No.: US 7,790,812 B2
(45) Date of Patent: Sep. 7, 2010

(54) EPOXY RESIN CURING AGENT PRODUCED BY HEATING ANHYDRIDE AND POLYESTER IN PRESENCE OF HYDROGEN AND HYDROGENATION CATALYST

(75) Inventors: Ryusuke Tanaka, Ichihara (JP); Minoru Suzuki, Chiba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 536 days.

(21) Appl. No.: 11/721,825

(22) PCT Filed: Dec. 6, 2005

(86) PCT No.: PCT/JP2005/022341

§ 371 (c)(1),
(2), (4) Date: Jun. 15, 2007

(87) PCT Pub. No.: WO2006/067955

PCT Pub. Date: Jun. 29, 2006

(65) Prior Publication Data

US 2009/0250825 A1    Oct. 8, 2009

(30) Foreign Application Priority Data

Dec. 21, 2004    (JP) .............................. 2004-369323

(51) Int. Cl.
*C08L 63/00* (2006.01)
*C08L 67/02* (2006.01)
*H01L 23/29* (2006.01)

(52) U.S. Cl. .................. 525/437; 257/793; 525/438
(58) Field of Classification Search ........................ None
See application file for complete search history.

(56) References Cited

U.S. PATENT DOCUMENTS

| 5,017,679 | A | * | 5/1991 | Chang et al. ................. 528/272 |
| 5,505,895 | A | * | 4/1996 | Bull et al. .................... 264/327 |
| 5,898,052 | A | * | 4/1999 | Okumura et al. ............. 523/457 |
| 6,268,021 | B1 | * | 7/2001 | Flosbach et al. ......... 427/407.1 |
| 6,380,352 | B1 | * | 4/2002 | Sumner et al. .............. 528/480 |

FOREIGN PATENT DOCUMENTS

| JP | 62-253614 | | 11/1987 |
| JP | 01-132621 | | 5/1989 |
| JP | 06-220163 | | 8/1994 |
| JP | 2000-196151 | | 7/2000 |
| JP | 2003-012896 | | 1/2003 |
| JP | 2003-026763 | | 1/2003 |
| JP | 2003-040972 | | 2/2003 |
| JP | 2003-221490 | | 8/2003 |
| JP | 2004-131553 | | 4/2004 |
| JP | 2004-131553 | A * | 4/2004 |

* cited by examiner

*Primary Examiner*—Robert Sellers
(74) *Attorney, Agent, or Firm*—Antonelli, Terry, Stout & Kraus, LLP.

(57) ABSTRACT

The present invention relates to a process for producing an acid anhydride-based epoxy resin curing agent, an acid anhydride-based epoxy resin curing agent, an epoxy resin composition, and a cured product and optical semiconductor device using the same. The process for producing an acid anhydride-based epoxy resin curing agent according to the present invention comprises heating a mixture containing a polyvalent carboxylic acid anhydride and a polyester resin in the presence of hydrogen gas and a hydrogenation catalyst.

10 Claims, No Drawings

EPOXY RESIN CURING AGENT PRODUCED BY HEATING ANHYDRIDE AND POLYESTER IN PRESENCE OF HYDROGEN AND HYDROGENATION CATALYST

TECHNICAL FIELD

The present invention relates to a process for producing an acid anhydride-based epoxy resin curing agent, an acid anhydride-based epoxy resin curing agent, an epoxy resin composition, and a cured product and optical semiconductor device using the same. More specifically, the present invention relates to a process for producing an acid anhydride-based epoxy resin curing agent, an acid anhydride-based epoxy resin curing agent, and an epoxy resin composition, which provide a cured product that exhibits minimal coloring and excellent levels of crack resistance and transparency, and a cured product and optical semiconductor device using the same.

BACKGROUND ART

Generally, epoxy resin cured products produced from an acid anhydride and an epoxy resin are low-cost, and yet exhibit excellent levels of transparency, electrical insulation, chemical resistance, moisture resistance and adhesiveness, and consequently they are used in a variety of applications, including as electrical insulation materials, semiconductor device materials, adhesive materials, and coating materials. An example of a typically representative application is the encapsulant used for protecting the light-emitting element of a light-emitting diode (hereafter, abbreviated as LED). However in recent years, the increasing use of white LEDs, which combine a light source that emits light of shorter wavelength with a fluorescent substance, has meant that deterioration of the encapsulant has become a significant problem.

In other words, because a white LED uses a higher energy light source, the encapsulant is more prone to deterioration and coloring, causing a shortening of the life of the LED, than conventional red and green LEDs. Furthermore, as improvements in the light-emitting element have lead to ongoing reductions in the size and increases in the current carrying capability of the element, the quantity of heat generated by the LED when lit for extended periods has increased, and this heat also causes deterioration of the encapsulant.

The need to suppress this type of deterioration caused by light and heat is a major barrier to more widespread use of epoxy resins. Epoxy resin compositions in which the aromatic epoxy resin, which is prone to deterioration caused by light or heat, is replaced with an alicyclic epoxy resin have been proposed as potential solutions to this problem of deterioration (for example, see Japanese Laid-Open Publication No. 2000-196151, Japanese Laid-Open Publication No. 2003-12896, Japanese Laid-Open Publication No. 2003-26763, and Japanese Laid-Open Publication No. 2003-221490).

However, epoxy resin compositions that use these alicyclic epoxy resins suffer a different disadvantage in that they produce a cured product that exhibits inferior toughness, and is prone to developing cracks under changes in conditions such as the temperature. A method of resolving this disadvantage, which uses a modifying agent comprising any of a variety of polymers to toughen the cured product obtained from the epoxy resin composition, is already known. For example, a method has been proposed wherein by adding a polyester resin to the epoxy resin composition, the toughness of the cured product is improved with no loss of transparency (for example, see Japanese Laid-Open Publication No. 2004-131553).

DISCLOSURE OF INVENTION

However, because polyester resins are usually prone to coloring on condensation, the cured products presented in the examples of the aforementioned invention disclosed in Japanese Laid-Open Publication No. 2004-131553 were noticeably colored, with colors ranging from yellow through to brown. As a result, these products are unusable in applications that require non-colored transparency, such as the aforementioned encapsulants for LEDs.

The present invention takes the above problems into consideration, with an object of providing a process for producing an acid anhydride-based epoxy resin curing agent, an acid anhydride-based epoxy resin curing agent, and an epoxy resin composition, which provide a cured product that exhibits minimal coloring and excellent levels of crack resistance and transparency, and a cured product and optical semiconductor device using the same.

As a result of intensive investigation aimed at resolving the above problems, the inventors of the present invention discovered that by adding a polyester resin, as a modifying agent, to a polyvalent carboxylic acid anhydride, mixing the two components together, and then heating the resulting mixture in the presence of hydrogen gas and a hydrogenation catalyst, an acid anhydride-based epoxy resin curing agent capable of producing a cured product with minimal coloring and excellent levels of crack resistance and transparency could be produced with relative ease, and they were hence able to complete the present invention.

In other words, the present invention relates to a process for producing an acid anhydride-based epoxy resin curing agent, comprising heating a mixture containing a polyvalent carboxylic acid anhydride and a polyester resin in the presence of hydrogen gas and a hydrogenation catalyst.

Furthermore, the present invention also relates to the acid anhydride-based epoxy resin curing agent produced by the above process.

Furthermore, the present invention also relates to an epoxy resin composition comprising an epoxy resin and the acid anhydride-based epoxy resin curing agent produced by the above process.

Furthermore, the present invention also relates to a cured product produced by curing the above epoxy resin composition.

In addition, the present invention also relates to an optical semiconductor device in which the optical semiconductor element is encapsulated by the above cured product.

This Application is based upon and claims the benefit of priority from prior Japanese Application 2004-369323 filed on Dec. 21, 2004; the entire contents of which are incorporated by reference herein.

BEST MODE FOR CARRYING OUT THE INVENTION

As follows is a more detailed description of the present invention.

The present invention provides a process for producing an acid anhydride-based epoxy resin curing agent, comprising heating a mixture containing a polyvalent carboxylic acid anhydride and a polyester resin in the presence of hydrogen gas and a hydrogenation catalyst. In the present invention, the mixture containing the polyvalent carboxylic acid anhydride and the polyester usually also contains impurities, such as peroxides and colored substances generated during the synthesis of the polyester resin, and unreacted polyester resin raw materials, in addition to the polyvalent carboxylic acid anhydride and the polyester resin. Moreover, the mixture containing the polyvalent carboxylic acid anhydride and the polyester may also contain additives such as antioxidants, plasticizers, and flame retardants.

In the present invention, it is thought that by heating the mixture containing the polyvalent carboxylic acid anhydride and the polyester in the presence of hydrogen gas and a hydrogenation catalyst, those compounds that contain unsaturated bonds within the mixture undergo hydrogenation, enabling an epoxy resin curing agent to be obtained that generates a cured product with minimal coloring and excellent transparency. Examples of compounds that contain unsaturated bonds within the mixture include a polyvalent carboxylic acid anhydride with unsaturated bonds in those cases where such a polyvalent carboxylic acid anhydride with unsaturated bonds is used as the polyvalent carboxylic acid anhydride, or a polyester resin with unsaturated bonds in those cases where such a polyester resin with unsaturated bonds is used as the polyester resin. In addition, examples of other compounds that contain unsaturated bonds within the mixture include the types of impurities and additives described above, although this is not an exhaustive list.

The process for producing an acid anhydride-based epoxy resin curing agent according to the present invention comprises, for example, a step of preparing a mixture by mixing a polyvalent carboxylic acid anhydride and a polyester, and a step of heating the prepared mixture in the presence of hydrogen gas and a hydrogenation catalyst. The process of the present invention is not restricted to this configuration, and also includes, for example, processes that comprise heating a pre-prepared mixture containing a polyvalent carboxylic acid anhydride and a polyester in the presence of hydrogen gas and a hydrogenation catalyst, as well as processes that include other optional steps, such as steps of preparing the polyester resin, or removing the hydrogenation catalyst by filtration.

There are no particular restrictions on the polyvalent carboxylic acid anhydride used in the present invention, and suitable examples include succinic anhydride, maleic anhydride, phthalic anhydride, tetrahydrophthalic anhydride, methyltetrahydrophthalic anhydride, methyl endo-methylenetetrahydrophthalic anhydride, itaconic anhydride, pyromellitic anhydride, and benzophenonetetracarboxylic anhydride. Combinations of two or more of these compounds may also be used.

In order to achieve the most dramatic manifestation of the characteristic effects of the cured product obtained using the present invention, namely, minimal coloring and excellent levels of crack resistance and transparency, the polyvalent carboxylic acid anhydride is preferably a compound represented by a general formula (1) shown below.

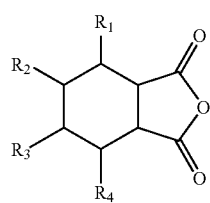

(1)

(in the formula, $R_1$ to $R_4$ each represent, independently, a hydrogen atom, or a straight-chain or branched alkyl group of 1 to 4 carbon atoms, and two groups selected from $R_1$ to $R_4$ may be bonded together to form a ring structure).

Specific examples of this type of compound include hexahydrophthalic anhydride, methylhexahydrophthalic anhydride, and methyl endo-methylenehexahydrophthalic anhydride. Combinations of two or more of these compounds may also be used.

There are no particular restrictions on the polyester resin used in the present invention, and a polyester resin synthesized using a dicarboxylic acid compound and a dialcohol compound can be used. Examples of suitable dicarboxylic acid compounds include aromatic dicarboxylic acid compounds, aliphatic dicarboxylic acid compounds, and the acid anhydrides thereof. Specific examples of suitable aromatic dicarboxylic acid compounds include terephthalic acid, isophthalic acid, phthalic acid and naphthalenedicarboxylic acid, and these acids may also include substituent groups. Specific examples of suitable aliphatic dicarboxylic acid compounds include adipic acid, sebacic acid, azelaic acid, succinic acid, fumaric acid, maleic acid, himic acid, 1,4-cyclohexanedicarboxylic acid and 1,6-cyclohexanedicarboxylic acid, and these acids may also include substituent groups. Specific examples of suitable dialcohol compounds include ethylene glycol, propylene glycol, 1,2-propanediol, 1,3-propanediol, 1,3-butanediol, 1,4-butanediol, neopentyl glycol, 1,5-pentanediol, 1,6-hexanediol, 3-methylpentanediol, diethylene glycol, 1,4-cyclohexanedimethanol, 3-methyl-1,5-pentanediol, 2-methyl-1,3-propanediol, 2,2-diethyl-1,3-propanediol, 2-butyl-2-ethyl-1,3-propanediol, xylylene glycol, hydrogenated bisphenol A, ethylene oxide adducts of bisphenol A, and propylene oxide adducts of bisphenol A, and these compounds may also include substituent groups.

Although there are no particular restrictions on the structure of the structural units of the polyester resin used in the present invention, in order to obtain a cured product with minimal coloring and superior levels of crack resistance and transparency, the polyester resin preferably contains at least one structural unit represented by one of the general formulas (2) through (4) shown below.

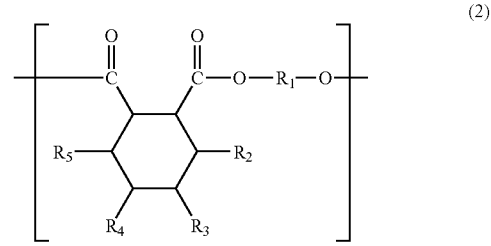

(2)

(in the formula, $R_1$ represents a straight-chain, branched or cyclic alkylene group of 2 to 15 carbon atoms, $R_2$ to $R_5$ each represent, independently, a hydrogen atom, or a straight-chain or branched alkyl group of 1 to 4 carbon atoms, and two groups selected from $R_2$ to $R_5$ may be bonded together to form a ring structure)

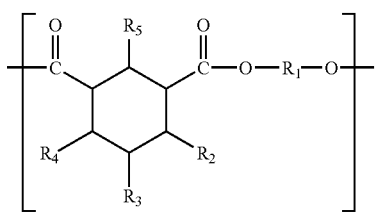

(3)

(in the formula, $R_1$ represents a straight-chain, branched or cyclic alkylene group of 2 to 15 carbon atoms, $R_2$ to $R_5$ each represent, independently, a hydrogen atom, or a straight-chain or branched alkyl group of 1 to 4 carbon atoms, and two groups selected from $R_2$ to $R_5$ may be bonded together to form a ring structure)

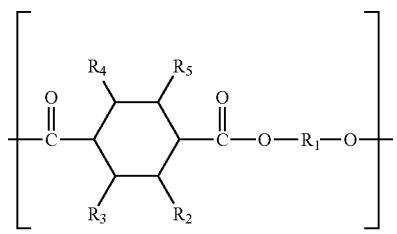

(4)

(in the formula, $R_1$ represents a straight-chain, branched or cyclic alkylene group of 2 to 15 carbon atoms, $R_2$ to $R_5$ each represent, independently, a hydrogen atom, or a straight-chain or branched alkyl group of 1 to 4 carbon atoms, and two groups selected from $R_2$ to $R_5$ may be bonded together to form a ring structure)

One example of a preferred polyester resin is the polyester resin containing the structural unit represented by a formula (5) shown below, obtained, for example, by condensation of methylhexahydrophthalic anhydride and ethylene glycol.

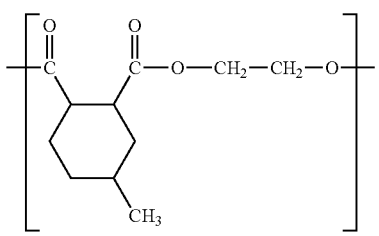

(5)

Furthermore, another preferred resin is the polyester resin containing the structural unit represented by a formula (6) shown below, obtained, for example, by condensation of 1,4-cyclohexanedicarboxylic acid and neopentyl glycol.

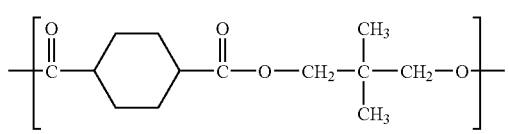

(6)

In the present invention, by using a polyester resin that comprises a total of at least 20 mol % of structural units represented by the aforementioned general formulas (2) through (4), the characteristic effects of a cured product obtained using the present invention, namely, minimal coloring and excellent levels of crack resistance and transparency, manifest more dramatically. The structural units represented by the general formulas (2) through (4) is preferably within a range from 20 to 100 mol %, and even more preferably from 50 to 100 mol %, and most preferably from 80 to 100 mol %, of the polyester resin.

The number average molecular weight of the polyester resin used in the present invention is preferably within a range from 3,000 to 100,000, and even more preferably from 6,000 to 30,000. If the number average molecular weight of the polyester resin is less than 3,000, then the toughness of the resulting cured product is inadequate, and there is a possibility of a deterioration in the crack resistance. In contrast, if the number average molecular weight of the polyester resin exceeds 100,000, then the miscibility of the resin with the polyvalent carboxylic acid anhydride deteriorates, increasing the possibility of a loss of transparency for the resulting cured product.

In the present invention, the number average molecular weight values use values referenced against standard polystyrene samples measured using GPC (gel permeation chromatography).

There are no particular restrictions on the process used for producing the polyester resin used in the present invention, and conventional processes can be employed.

In the present invention, there are no particular restrictions on the method used for mixing the polyvalent carboxylic acid anhydride and the polyester resin, and conventional methods can be used. The mixing is preferably conducted under an atmosphere of nitrogen gas, and the polyvalent carboxylic acid anhydride and the polyester resin are preferably stirred for a period of 30 to 100 minutes, and even more preferably 45 to 80 minutes. The temperature during stirring is preferably within a range from 60 to 130° C., and even more preferably from 90 to 120° C.

In the present invention, the quantity of the polyester resin is preferably within a range from 1 to 60% by weight, and even more preferably from 5 to 30% by weight, of the entire mixture containing the polyvalent carboxylic acid anhydride and the polyester resin. If the quantity of the polyester resin is less than 1% by weight, then the toughness of the resulting cured product is inadequate, and there is a possibility of a deterioration in the crack resistance. In contrast, if the quantity of the polyester resin exceeds 60% by weight, then there is a possibility of a marked reduction in the transparency and heat resistance of the resulting cured product.

In those cases where the polyvalent carboxylic acid anhydride is a solid, a solvent may be used temporarily to simplify handling during the heating step. A suitable solvent that is stable relative to hydrogenation, does not impair the activity of the catalyst, and does not react with the acid anhydride can be selected in accordance with the intended purpose. Examples of this type of solvent include ethers such as diethyl ether, tetrahydrofuran and dioxane, fatty acid esters such as ethyl acetate and ethyl butyrate, and hydrocarbons such as cyclohexane.

The quantity used of the solvent is preferably no more than 10 times, and even more preferably no more than 3 times, the weight of the entire mixture containing the polyvalent carboxylic acid anhydride and the polyester resin. If the quantity of the solvent exceeds 10 times the weight of the mixture, then the productivity deteriorates and the process becomes uneconomic.

In the present invention, there are no particular restrictions on the method used for heating the mixture containing the polyvalent carboxylic acid anhydride and the polyester resin in the presence of hydrogen gas and a hydrogenation catalyst, and conventional hydrogenation methods such as a liquid-phase suspension reaction or a method that utilizes a fixed bed can be employed.

The hydrogenation catalyst used in the present invention preferably comprises either an iron group element such as iron, cobalt or nickel, or a platinum group element such as ruthenium, palladium, rhodium, osmium, iridium or platinum as the active component, and catalysts in which the active component is supported on a carrier are particularly desirable. Examples of suitable carriers include carbon, alumina, silica, silica-alumina, and diatomaceous earth.

The quantity used of the hydrogenation catalyst is preferably within a range from 0.01 to 20 parts by weight, and even more preferably from 0.05 to 3 parts by weight, per 100 parts by weight of the mixture containing the polyvalent carboxylic acid anhydride and the polyester resin. If the quantity of the hydrogenation catalyst is less than 0.01 parts by weight, then the reaction rate becomes overly slow, causing a fall in productivity. In contrast, if the quantity of the hydrogenation catalyst exceeds 20 parts by weight, then because the hydrogenation catalyst is typically quite expensive, the process becomes uneconomic.

The reaction temperature during the heating step is preferably within a range from 30 to 230° C., and even more preferably from 50 to 160° C. If the reaction temperature is less than 30° C., then a considerable length of time is required for the reaction to proceed to completion, causing a fall in productivity. In contrast, if the reaction temperature exceeds 230° C., then there is a possibility of an increase in undesirable side reactions.

The heating step is preferably conducted under pressure. The reaction pressure during the heating step is preferably within a range from 0.5 to 30 MPa, and even more preferably from 1 to 15 MPa. If the reaction pressure is less than 0.5 MPa, then a considerable length of time is required for the reaction to proceed to completion, causing a fall in productivity. In contrast, if the reaction pressure exceeds 30 MPa, then special equipment capable of withstanding high pressures is required.

In the heating step conducted in the presence of hydrogen gas and the hydrogenation catalyst, the pressure inside the system falls as the reaction proceeds. The system may be replenished with hydrogen if required, and the end point of the reaction can be adjudged to be the point at which the pressure ceases to fall. Following completion of the reaction, the target acid anhydride-based epoxy resin curing agent can be obtained by separating the catalyst using a conventional method such as filtration or centrifugal separation, and removing the solvent in those cases where a solvent has been used.

An epoxy resin composition according to the present invention can be obtained by mixing the acid anhydride-based epoxy resin curing agent obtained in accordance with the present invention, with an epoxy resin. There are no particular restrictions on the process for producing the epoxy resin, and conventional processes can be used.

The quantity used of the acid anhydride-based epoxy resin curing agent is preferably sufficient to provide from 0.8 to 1 equivalent, and even more preferably from 0.9 to 1 equivalent, of acid anhydride groups per 1 equivalent of epoxy groups within the epoxy resin. If the quantity of acid anhydride groups is less than 0.8 equivalents, then there is a possibility of a deterioration in the crack resistance of the cured product. Furthermore, if the quantity of acid anhydride groups exceeds 1 equivalent, then similarly, there is a possibility of a deterioration in the crack resistance of the cured product.

Although there are no particular restrictions on the epoxy resin used in the present invention, from the viewpoints of achieving favorable light-fastness and heat resistance, an alicyclic epoxy resin is preferred. An alicyclic epoxy resin contains an alicyclic skeleton and two or more epoxy groups within each molecule, and suitable examples include 3',4'-epoxycyclohexylmethyl-3,4-epoxycyclohexane carboxylate, bis(3,4-epoxycyclohexylmethyl) adipate, vinylcyclohexene dioxide, and hydrogenated bisphenol A diglycidyl ether. Combinations of two or more of these resins may also be used.

Furthermore, depending on the intended purpose, an epoxy resin other than an alicyclic epoxy resin can also be used. Examples of this type of epoxy resin include bisphenol type epoxy resins, obtained by reaction between a bisphenol such as bisphenol A or bisphenol S and epichlorohydrin, phenol novolak type epoxy resins, obtained by reaction between a phenol novolak and epichlorohydrin, and glycidyl ester type epoxy resins obtained by reaction between a polyvalent carboxylic acid and epichlorohydrin. Combinations of two or more of these resins may also be used.

The quantity used of such an epoxy resin other than the alicyclic epoxy resin is preferably within a range from 0 to 80% by weight, and even more preferably from 0 to 20% by weight, relative to the quantity of the alicyclic epoxy resin. If this quantity of the epoxy resin other than the alicyclic epoxy resin exceeds 80% by weight, then there is a possibility of a deterioration in the light-fastness and heat resistance of the cured product.

Depending on the intended purpose, a suitable curing accelerator can also be added to the epoxy resin composition of the present invention. Examples of suitable curing accelerators include imidazoles such as 2-ethyl-4-methylimidazole and 1-methylimidazole, tertiary amines such as benzyldimethylamine and N,N-dimethylaniline, quaternary ammonium salts such as tetramethylammonium chloride and benzyltriethylammonium chloride, phosphonium salts such as tetra-n-butylphosphonium o,o-diethylphosphorodithionate and tetrabutylphosphonium benzotriazolate, metal salts such as zinc octoate and zinc stearate, and metal complexes such as acetylacetone zinc and benzoylacetone zinc.

The quantity used of the curing accelerator is preferably within a range from 0.01 to 8 parts by weight, and even more preferably from 0.1 to 5 parts by weight, per 100 parts by weight of the epoxy resin. If the quantity of the curing accelerator is less than 0.01 parts by weight, then there is a possibility that a satisfactory effect will be unobtainable. In contrast, if the quantity of the curing accelerator exceeds 8 parts by weight, there are increased possibilities of coloring of the cured product and a deterioration in the heat resistance.

A variety of different additives can also be added to the epoxy resin composition of the present invention depending on the intended purpose of the composition, provided the additives do not impair the characteristic features of the resulting cured product. Examples of possible additives include flexibility imparting agents, heat stabilizers, ultraviolet absorbers, flame retardants, antistatic agents, antifoaming agents, thixotropic imparting agents, and mold release agents.

By heat curing an epoxy resin composition according to the present invention, a cured product that exhibits minimal coloring, excellent levels of crack resistance and transparency, and excellent levels of light-fastness and heat resistance can be obtained. There are no particular restrictions on the method of producing the cured product, and conventional methods can be employed. There are no particular restrictions on the temperature and time of the heat curing process, but a temperature of 90 to 180° C. and a time of 1 to 12 hours are preferred. By disposing the epoxy resin composition on the surface of a LED light-emitting element or the like using an application, potting, or impregnation method, and then conducting heat curing, the LED light-emitting element can be encapsulated.

A semiconductor device of the present invention comprises an optical semiconductor element such as an LED light-emitting element or a photodiode element that has been encapsulated with the cured product described above, and exhibits minimal coloring, excellent levels of crack resistance and transparency, and excellent levels of light-fastness and heat resistance.

The process for producing an acid anhydride-based epoxy resin curing agent according to the present invention enables the provision of an acid anhydride-based epoxy resin curing agent, and an epoxy resin composition, which are capable of providing a cured product that exhibits minimal coloring, excellent levels of crack resistance and transparency, and excellent levels of light-fastness and heat resistance, and a cured product and optical semiconductor device thereof.

EXAMPLES

As follows is a description of specifics of the present invention based on a series of examples, although the present invention is in no way limited by the examples below.

Example 1

A reaction vessel fitted with a stirrer, a thermometer and a reflux condenser was charged with 172 parts by weight of 1,4-cyclohexanedicarboxylic acid, 208 parts by weight of neopentyl glycol and 0.1 parts by weight of tetrabutyl titanate, the resulting mixture was heated to 160° C., and the temperature was then raised from 160° C. to 250° C. over a period of 4 hours. Subsequently, the pressure was reduced to 5 mmHg over a period of one hour, and following a further pressure reduction to 0.3 mmHg, the mixture was reacted for one hour at 250° C., thus yielding a polyester resin (I).

A reaction vessel fitted with a stirrer, a thermometer and a gas inlet tube was charged with 20 parts by weight of the polyester resin (I) and 80 parts by weight of 4-methylhexahydrophthalic anhydride (HN-7000, manufactured by Hitachi Chemical Co., Ltd.) as the polyvalent carboxylic acid anhydride, and the mixture was stirred at 110° C. for 45 minutes under a stream of nitrogen gas, thereby achieving completely uniform dissolution and yielding a mixture (I).

An induction stirring autoclave was charged with 100 parts by weight of the mixture (I) and 0.3 parts by weight of a 5% by weight palladium/carbon catalyst as the hydrogenation catalyst, and the inside of the autoclave was flushed with nitrogen. The nitrogen inside the autoclave was then replaced with hydrogen, and the mixture was heated for 9 hours at 80° C. and 3 MPa. Following completion of the heating, the mixture was cooled, and then filtered using a 5C filter paper, thereby removing the hydrogenation catalyst and yielding an acid anhydride-based epoxy resin curing agent (I).

To 140 parts by weight of the acid anhydride-based epoxy resin curing agent (I) were added 100 parts by weight of 3',4'-epoxycyclohexylmethyl-3,4-epoxycyclohexane carboxylate (Celoxide 2021P, epoxy equivalent 138 g/eq, manufactured by Daicel Chemical Industries, Ltd.), 1 part by weight of tetra-n-butylphosphonium o,o-diethylphosphorodithionate (Hishicolin PX-4ET, manufactured by Nippon Chemical Industrial Co., Ltd.) as a curing accelerator, 1 part by weight of 9,10-dihydro-9-phospha-10-oxaphenanthrene-9-oxide (HCA, manufactured by Sanko Chemical Co., Ltd.) as a stabilizer, and 4 parts by weight of ethylene glycol as a flexibility imparting agent, and the resulting mixture was heated to 80° C. and stirred to achieve uniform dissolution, thus yielding an epoxy resin composition (I).

Following thorough defoaming of the epoxy resin composition (I) under reduced pressure, the composition was injected gently into a metal petri dish with a metal clip placed in the center of the dish, and was subsequently heated for one hour at 120° C., and then for a further 4 hours at 150° C., thereby yielding a disc-shaped cured product (I) with a diameter of 60 mm and a thickness of 10 mm.

Example 2

Synthesis was conducted in the same manner as the example 1, using 101 parts by weight of 4-methylhexahydrophthalic anhydride (HN-7000, manufactured by Hitachi Chemical Co., Ltd.), 61 parts by weight of tetrahydrophthalic anhydride, 120 parts by weight of neopentyl glycol, 19 parts by weight of ethylene glycol, and 0.06 parts by weight of tetrabutyl titanate, thereby yielding a polyester resin (II).

A reaction vessel fitted with a stirrer, a thermometer and a gas inlet tube was charged with 30 parts by weight of the polyester resin (II) and 70 parts by weight of methylhexahydrophthalic anhydride (HN-5500, manufactured by Hitachi Chemical Co., Ltd.) as the polyvalent carboxylic acid anhydride, and the mixture was stirred at 110° C. for one hour under a stream of nitrogen gas, thereby achieving completely uniform dissolution and yielding a mixture (II).

An induction stirring autoclave was charged with 100 parts by weight of the mixture (II) and 0.3 parts by weight of a 5% by weight palladium/carbon catalyst as the hydrogenation catalyst, and the inside of the autoclave was flushed with nitrogen. The nitrogen inside the autoclave was then replaced with hydrogen, and the mixture was heated for 8 hours at 110° C. and 5 MPa. Following completion of the heating, the mixture was cooled, and then filtered using a 5C filter paper, thereby removing the hydrogenation catalyst and yielding an acid anhydride-based epoxy resin curing agent (II).

An epoxy resin composition (II) and a cured product (II) were then obtained in the same manner as the example 1.

Example 3

Synthesis was conducted in the same manner as the example 1, using 52 parts by weight of 1,2-cyclohexanedicarboxylic acid, 83 parts by weight of isophthalic acid, 40 parts by weight of sebacic acid, 120 parts by weight of neopentyl glycol, 12 parts by weight of 1,6-hexanediol, and 0.06 parts by weight of tetrabutyl titanate, thereby yielding a polyester resin (III).

A reaction vessel fitted with a stirrer, a thermometer and a gas inlet tube was charged with 30 parts by weight of the polyester resin (III) and 70 parts by weight of methylhexahydrophthalic anhydride (HN-5500, manufactured by Hitachi Chemical Co., Ltd.) as the polyvalent carboxylic acid anhydride, and the mixture was stirred at 110° C. for 40 minutes under a stream of nitrogen gas, thereby achieving completely uniform dissolution and yielding a mixture (III).

An induction stirring autoclave was charged with 100 parts by weight of the mixture (III) and 0.5 parts by weight of a 5% by weight rhodium/carbon catalyst as the hydrogenation catalyst, and the inside of the autoclave was flushed with nitrogen. The nitrogen inside the autoclave was then replaced with hydrogen, and the mixture was heated for 8 hours at 80° C. and 8 MPa. Following completion of the heating, the mixture was cooled, and then filtered using a 5C filter paper, thereby removing the hydrogenation catalyst and yielding an acid anhydride-based epoxy resin curing agent (III).

An epoxy resin composition (III) and a cured product (III) were then obtained in the same manner as the example 1.

Comparative Example 1

A mixture (I) was prepared in the same manner as the example 1, and this mixture was then filtered using a 5C filter paper, yielding an acid anhydride-based epoxy resin curing agent (IV).

An epoxy resin composition (IV) and a cured product (IV) were then obtained in the same manner as the example 1.

Comparative Example 2

4-methylhexahydrophthalic anhydride (HN-7000, manufactured by Hitachi Chemical Co., Ltd.) was used, without modification, as an acid anhydride-based epoxy resin curing agent (V).

An epoxy resin composition (V) and a cured product (V) were then obtained in the same manner as the example 1.

The compositions and number average molecular weights of the polyester resins (I) to (V) obtained in the examples 1 to 3 and the comparative examples 1 and 2, together with the hues of the acid anhydride-based epoxy resin curing agents (I) to (III), and the colors, level of cracking, and glass transition temperatures of the cured products (I) to (V) were evaluated using the methods described below. The results are shown in Table 1. The methods used for evaluating the properties shown in Table 1 are described below.

(Polyester Resin Properties)

Compositions of the acid component and the diol component: analyzed by $^1$H-NMR. Number average molecular weight: measured using gel permeation chromatography.
- columns: two Gelpack GL-A100M columns (manufactured by Hitachi Chemical Co., Ltd.) connected in series
- eluent: tetrahydrofuran (flow rate: 1.0 ml/minute)
- RI detector: Shodex SE-61
- standard polystyrene: PS706

(Acid Anhydride-based Epoxy Resin Curing Agent Properties)

Hue: measured by a method that uses a color number in Hazen units, as described in JIS K 0071-1.

(Cured Product Properties)

External appearance: evaluated visually.

Cracking: the cured product was left to stand at −30° C. for 20 hours and then at room temperature for 10 hours, and was then inspected visually for the existence of cracks.
- A: no cracks
- B: cracks Glass transition temperature: a sample of dimensions 2 mm×5 mm×5 mm was cut from the cured product, and then measured by thermomechanical analysis (TMA).
- measurement apparatus: SSC-5200 (manufactured by Seiko Instruments Inc.)
- measurement conditions: load 20 g/temperature increase: 5° C. per minute

TABLE 1

Properties of polyester resins, acid anhydride-based epoxy resin curing agents, and cured products.

| Item | | | Example 1 | Example 2 | Example 3 | Comparative example 1 | Comparative example 2 |
|---|---|---|---|---|---|---|---|
| Polyester resin | Composition of acid component (mol %) | 1,4-cyclohexane-dicarboxylic acid | 100 | — | — | 100 | Contains no polyester resin |
| | | 1,2-cyclohexane-dicarboxylic acid | — | — | 30 | — | |
| | | 4-methylhexahydro-phthalic anhydride | — | 60 | — | — | |
| | | tetrahydrophthalic anhydride | — | 40 | — | — | |
| | | isophthalic acid | — | — | 50 | — | |
| | | sebacic acid | — | — | 20 | — | |
| | Composition of diol component (mol %) | neopentyl glycol | 100 | 75 | 90 | 100 | |
| | | ethylene glycol | — | 25 | — | — | |
| | | 1,6-hexanediol | — | — | 10 | — | |
| | Number average molecular weight | | 9,600 | 8,000 | 6,400 | 9,600 | |
| Existence of heating step | | | Yes | Yes | Yes | No | No |
| Hue (APHA) of acid anhydride-based epoxy resin curing agent | | | 40 | 50 | 50 | 80 | 10 |
| Cured Product | External appearance | | Colorless, transparent | Faint yellow, transparent | Colorless, transparent | Yellow, transparent | Colorless, transparent |
| | Cracking | | A | A | A | A | B |
| | Glass transition temperature (° C.) | | 178 | 183 | 182 | 179 | 191 |

The invention claimed is:

1. A process for producing an acid anhydride-based epoxy resin curing agent, comprising: heating a mixture comprising a polyvalent carboxylic acid anhydride and a polyester resin in presence of hydrogen gas and a hydrogenation catalyst, wherein the polyester resin comprises at least one structural unit represented by one of general formulas (2) through (4) shown below:

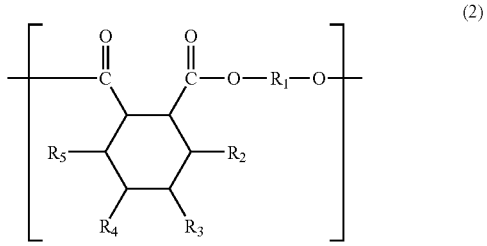

(2)

(in the formula, $R_1$ represents a straight-chain, branched or cyclic alkylene group of 2 to 15 carbon atoms, $R_2$ to $R_5$ each represent, independently, a hydrogen atom, or a straight-chain or branched alkyl group of 1 to 4 carbon atoms, and two groups selected from $R_2$ to $R_5$ may be bonded together to form a ring structure),

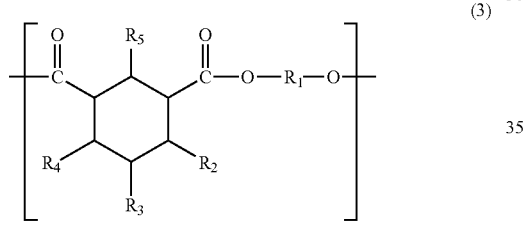

(3)

(in the formula, $R_1$ represents a straight-chain, branched or cyclic alkylene group of 2 to 15 carbon atoms, $R_2$ to $R_5$ each represent, independently, a hydrogen atom, or a straight-chain or branched alkyl group of 1 to 4 carbon atoms, and two groups selected from $R_2$ to $R_5$ may be bonded together to form a ring structure),

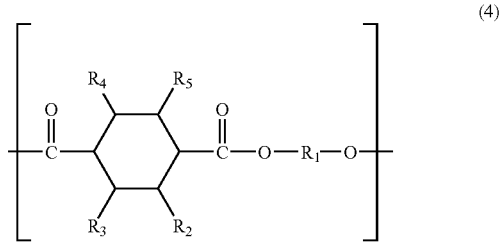

(4)

(in the formula, $R_1$ represents a straight-chain, branched or cyclic alkylene group of 2 to 15 carbon atoms, $R_2$ to $R_5$ each represent, independently, a hydrogen atom, or a straight-chain or branched alkyl group of 1 to 4 carbon atoms, and two groups selected from $R_2$ to $R_5$ may be bonded together to form a ring structure).

2. The process for producing an acid anhydride-based epoxy resin curing agent according to claim 1, wherein the polyester resin comprises a total of at least 20 mol % of structural units represented by the general formulas (2) through (4).

3. The process for producing an acid anhydride-based epoxy resin curing agent according to claim 1, wherein the number average molecular weight of the polyester resin is within a range from 3,000 to 100,000.

4. The process for producing an acid anhydride-based epoxy resin curing agent according to claim 1, wherein a quantity of the polyester resin is within a range from 1 to 60% by weight of the entire mixture comprising the polyvalent carboxylic acid anhydride and the polyester resin.

5. The process for producing an acid anhydride-based epoxy resin curing agent according to claim 1, wherein the hydrogenation catalyst comprises an iron group element or a platinum group element.

6. An acid anhydride-based epoxy resin curing agent produced by the process according to claim 1.

7. An epoxy resin composition, comprising an epoxy resin and the acid anhydride-based epoxy resin curing agent produced by the process according to claim 1.

8. A cured product produced by curing the epoxy resin composition according to claim 7.

9. An optical semiconductor device, wherein an optical semiconductor element is encapsulated by the cured product according to claim 8.

10. A process for producing an acid anhydride-based epoxy resin curing agent, comprising: heating a mixture comprising a polyvalent carboxylic acid anhydride and a polyester resin in presence of hydrogen gas and a hydrogenation catalyst, wherein the polyvalent carboxylic acid anhydride is a compound represented by a general formula (1) shown below:

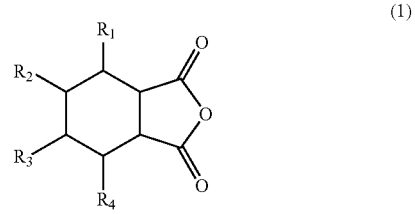

(1)

in the formula, $R_1$ to $R_4$ each represent, independently, a hydrogen atom, or a straight-chain or branched alkyl group of 1 to 4 carbon atoms, and two groups selected from $R_1$ to $R_4$ may be bonded together to form a ring structure), and wherein the polyester resin comprises at least one structural unit represented by one of general formulas (2) through (4) shown below:

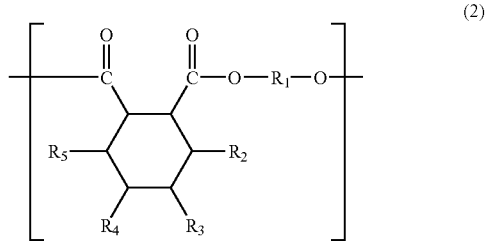

(2)

(in the formula, $R_1$ represents a straight-chain, branched or cyclic alkylene group of 2 to 15 carbon atoms, $R_2$ to $R_5$ each represent, independently, a hydrogen atom, or a straight-chain or branched alkyl group of 1 to 4 carbon atoms, and two groups selected from $R_2$ to $R_5$ may be bonded together to form a ring structure),

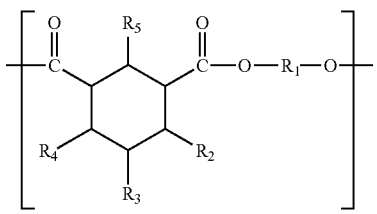
(3)

(in the formula, $R_1$ represents a straight-chain, branched or cyclic alkylene group of 2 to 15 carbon atoms, $R_2$ to $R_5$ each represent, independently, a hydrogen atom, or a straight-chain or branched alkyl group of 1 to 4 carbon atoms, and two groups selected from $R_2$ to $R_5$ may be bonded together to form a ring structure),

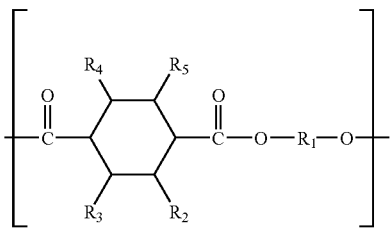
(4)

(in the formula, $R_1$ represents a straight-chain, branched or cyclic alkylene group of 2 to 15 carbon atoms, $R_2$ to $R_5$ each represent, independently, a hydrogen atom, or a straight-chain or branched alkyl group of 1 to 4 carbon atoms, and two groups selected from $R_2$ to $R_5$ may be bonded together to form a ring structure).

\* \* \* \* \*